United States Patent [19]
Hara et al.

[11] Patent Number: 5,225,956
[45] Date of Patent: Jul. 6, 1993

[54] SUPERCONDUCTING AC CURRENT LIMITER EQUIPPED WITH QUICK-RECOVERABLE TRIGGER COILS

[75] Inventors: Tsukushi Hara, Saitama; Kiyoshi Okaniwa, Tokyo; Kazuyuki Tsurunaga, Tokyo; Mitsuhito Sawamura, Tokyo; Yoshihisa Masuda, Tokyo; Daisuke Ito, Kanagawa, all of Japan

[73] Assignees: The Tokyo Electric Power Company, Incorporated, Tokyo; Kabushiki Kaisha Toshiba, Kawasaki, both of Japan

[21] Appl. No.: 723,307

[22] Filed: Jun. 28, 1991

[30] Foreign Application Priority Data

Jun. 28, 1990 [JP] Japan .................. 2-168526

[51] Int. Cl.$^5$ ............................ H02H 9/02
[52] U.S. Cl. ........................ 361/19; 361/58; 505/850
[58] Field of Search .............. 361/19, 58, 141; 323/160; 509/890, 881

[56] References Cited

U.S. PATENT DOCUMENTS

| | | | |
|---|---|---|---|
| 2,350,195 | 5/1944 | Rypinski | 361/19 |
| 4,336,561 | 6/1982 | Murphy | 361/19 |
| 5,021,914 | 6/1991 | Tsurunga et al. | 361/19 |

FOREIGN PATENT DOCUMENTS

0228584 7/1987 European Pat. Off. .
0350916 1/1990 European Pat. Off. .

Primary Examiner—Todd E. DeBoer
Attorney, Agent, or Firm—Oblon, Spivak, McClelland, Maier & Neustadt

[57] ABSTRACT

In a superconducting AC (alternating current) current limiter, quenched trigger coil assembly is quickly recovered to the superconductive state by minimizing a loop current flowing through the trigger coil assembly. The superconducting AC current limiter comprises: a cylindrical core; a superconducting current limiting coil wound on the core, and inserted into an AC power transmission line, for limiting an overcurrent flowing through the AC power transmission line when a failure happens to occur therein; a superconducting trigger coil assembly coaxially wound inside the superconducting current limiting coil on the core, and magnetically coupled to the current limiting coil, for triggering current limiting operation by the current limiting coil when most of the overcurrent flows through the trigger coil assembly, the superconducting trigger coil assembly being arranged by first, second, third and fourth trigger coils in such a manner that the first trigger coil is series-connected to the fourth trigger coil thereby to constitute a first series trigger coil circuit, the second trigger coil is series-connected to the third trigger coil thereby to constitute a second series trigger coil circuit, the first and second series trigger coil circuits are connected in parallel with each other, one end of which is connected to one end of the superconducting current limiting coil and the other end of which is connected via a quenching switch to the other end of the current.

8 Claims, 5 Drawing Sheets

SUPERCONDUCTING AC CURRENT LIMITER EQUIPPED WITH QUICK-RECOVERABLE TRIGGER COILS

BACKGROUND OF THE INVENTION

1. Field of the Invention

The present invention generally relates to a superconducting AC current limiter for limiting an overcurrent flowing through an AC (alternating current) power transmission line. More specifically, the present invention is directed to a superconducting AC current limiter equipped with trigger coils made of a superconductor material, which can be quickly recovered to the superconductive state.

2. Description of the Related Art

As is known in an AC power transmission line, e.g., 3-phase power transmission line, when a shortcircuit or a ground fault happens to occur, a failure current will be increased up to several tens to several hundreds killoamperes, which will cause serious damages to various electric appliances connected to the transmission line. To avoid such power failure damages, various current limiters have been proposed. For instance, superconducting current limiters are very recently utilized so as to immediately detect and suppress such very high failure currents.

Various sorts of superconducting current limiters have been proposed in, for instance, a copending U.S. patent application Ser. No. 379,117 filed on Jul. 13, 1989 entitled "SUPERCONDUCTING SWITCH AND CURRENT LIMITER USING SUCH A SWITCH" assigned to one of the present assignees, now U.S. Pat. No. 5,021,914 and U.S. Pat. No. 4,700,257 to Bekhaled, entitled "SUPERCONDUCTIVE AC CURRENT LIMITER". Also, another different type of superconducting current limiter has been disclosed in Japanese patent application No. 1-283200, filed on Oct. 31, 1990 assigned to one of the present assignees.

Furthermore, there is shown in FIG. 1, another conventional superconducting current limiter 3 using a superconductive conductor. The superconducting current limiter 3 is interposed between an AC power supply 1 and a load 4 via a circuit breaker 2. This superconducting current limiter 3 is mainly constructed of a superconductive current limiting coil $3a$, and two superconductive trigger coils $3b$ and $3c$ which are connected in parallel with each other, and also in parallel with the current limiting coil $3a$ via a trigger switch $3d$. This trigger switch $3d$ is turned ON/OFF by a quenching sensor $3g$. Symbols $T_1$, $T_2$, $T_3$ indicate terminals of this conventional current limiter 3.

FIG. 2 illustrates an internal construction of the superconducting current limiter 3 arranged by mainly the above-described current limiting coil $3a$, and trigger coils $3b$ and $3c$. As apparent from this drawing, the conventional superconducting current limiter 3 is so constructed that the current limiting coil $3a$ and trigger coils $3b$, $3c$ are coaxially wound on a core 51; two trigger coils $3b$ and $3c$ are wound inside the current limiting coil $3a$ under non-electromagnetic induction condition (so-called "Ayrton-Perry windings") by which electromagnetic forces are mutually produced in opposite directions; and both ends of these trigger coils $3b$ and $3c$ are connected to each other to constitute a single parallel coil circuit. One terminal of this single parallel coil circuit is connected to one end of the current limiting coil $3a$. Then, the current limiting coil $3a$ will constitute such a superconducting reactor having a predetermined inductance, whereas the trigger coils $3b$ and $3c$ will have a superconducting switch function being quenched by a predetermined AC current value. The above-described non-electromagnetic induction state may be understood from FIG. 3. That is, the magnetic fluxes $\phi_a$, $\phi_b$, $\phi_c$ produced from the current limiting coil $3a$, and trigger coils $3b$ and $3c$, respectively, mutually intersect with each other, and since the trigger coils $3b$ and $3c$ are wound in a very close relationship with each other and in the opposite winding direction, these magnetic fluxes $\phi_b$ and $\phi_c$ induced from the trigger coils $3b$ and $3c$ are canceled with each other under the normal current, resulting the non-electromagnetic induction state.

In the conventional superconducting current limiter with the above-described arrangement, during the normal conduction (i.e., no overcurrent, or failure current), the overall AC current supplied from the AC power supply 1 passes through the breaker 2, and thereafter most of this current substantially equally flows through these superconducting trigger coils $3b$ and $3c$, but substantially no current flows through the current limiting coil $3a$. As a result, a voltage across the current limiting coil $3a$ becomes very small, so that the quenching sensor $3g$ for monitoring this voltage is not brought into the active condition. Under such a condition, assuming now that either a shortcircuit failure, or a ground line failure happens to occur in the load 4 and thus a very large failure current may substantially flow through this load 4, the trigger coils $3b$ and $3c$ are quenched when this failure current reaches the critical current value of the trigger coils and then represent higher resistance values. Once the trigger coils $3b$ and $3c$ are quenched and represent the higher resistance values, most of the circuit current (i.e., failure current) which have flown through the trigger coils $3b$ and $3c$, immediately change their paths. That is, most of the failure current flows through the current limiting coil $3a$. As a consequence, this failure current may be reduced to an allowable current value due to the reactor effect caused by this current limiting coil $3a$. Then, a voltage appears on both ends of this current limiting coil $3a$, which is directly proportional to a product made by this reduced current value and the impedance of the current limiting coil $3a$. This voltage is detected by the quenching sensor $3g$. As a result, the quenching sensor $3g$ enables the trigger switch $3d$ to be opened, so that a small current flowing through the trigger coils $3b$ and $3c$ may be interrupted to reduce Joule heat generated by the trigger coils to zero. Accordingly, this may cause quick recovery of the coils to the superconductive state.

In the above-described conventional superconducting current limiter, when the current limiting coil is brought into the current limiting state, most of the magnetic flux $\phi_a$ produced from this current limiting coil $3a$ intersect the trigger coils $3b$ and $3c$, as readily apparent from FIG. 2. As a result, when the trigger switch $3d$ is opened by the quenching sensor $3g$, the electromagnetic force "$e_{TC}$" is simultaneously induced in the trigger coils $3b$ and $3c$ in the direction along which the magnetic fluxes $\phi_a$ may be canceled by this force, and then the loop current "$i_{TCL}$" flows through the trigger coils $3b$ and $3c$, as represented in FIG. 1. The value of this loop current "$i_{TCL}$" is defined by a ratio of the electromagnetic force "$e_{TC}$" to an internal impedance "$Z_{TCi}$"

of the trigger coil and given by the following equation (1):

$$i_{TCL} = \frac{e_{TC}}{Z_{TCt}} \quad (1)$$

Then, the internal impedance "$Z_{TCt}$" of the trigger coil is defined by a vector summation among self-inductances $L_1$ and $L_2$ of the trigger coils 3b and 3c, a mutual inductance M and restance values of quenched single superconducting coil lines $R_1$ and $R_2$, and is given by the following equation (2):

$$Z_{TCt} = \sqrt{\{\omega(L_1 + L_2 + 2M)\}^2 + (R_1 + R_2)^2} \quad (2)$$

where, $\omega = 2\pi f$.

The more, a degree of the superconducting recovery effect of the trigger coils 3b and 3c progresses, the smaller this internal impedance $Z_{TCt}$ becomes. In other words, the larger, the superconducting area of the single coil line becomes along its longitudinal direction, the smaller the internal impedance becomes. As a result, the loop current "$i_{TCL}$" flowing through the trigger coils 3b, 3c conversely becomes high, and thus the Joule heat loss of the coil line region under non-superconducting state is increased. This may cause various problems. That is, cooling helium used to refrigerate this current limiter 3 which is entirely surrounded by this liquid helium, is highly consumed, and furthermore, the recovery time of the trigger coils to the superconducting state is delayed. In addition, the electromagnetic force "$e_{TC}$" induced by this loop current may cancel the electromagnetic flux $\phi_a$ induced by the current limiting coil 3a, whereby the resultant indictance of the current limiting coil 3a is lowered.

SUMMARY OF THE INVENTION

The present invention has been made in an attempt to solve the above-described problems of the conventional superconducting AC current limiter, and has an object to provide superconducting AC current limiter wherein an electromagnetic force produced by trigger coils is minimized during current limiting operation, and time required for recovering the trigger coils to superconducting states is shortened, whereby a Joule heat loss is suppressed and a total amount of consumed coolant is also suppressed.

A superconducting AC current limiter (100), according to the present invention, comprises:
core means (51);
a superconducting current limiting coil (3a) wound on the core means (51), and inserted into an AC (alternating current) power transmission line, for limiting an overcurrent flowing through the AC power transmission line when a failure happens to occur therein;
a superconducting trigger coil assembly (30) coaxially wound inside the superconducting current limiting coil (3a) on the core means (51), and magnetically coupled to the current limiting coil (3a), for triggering current limiting operation by the current limiting coil (3a) when most of said overcurrent flows through the trigger coil assembly (30), said superconducting trigger coil assembly (30) being arranged by first, second, third and fourth trigger coils (3B, 3C, 3D, 3E) in such a manner that said first trigger coil (3B) is series-connected to said fourth trigger coil (3E) thereby to constitute a first series trigger coil circuit, said second trigger coil (3C) is series-connected to said third trigger coil (3D) thereby to constitute a second series trigger coil circuit, said first and second series trigger coil circuits are connected in parallel with each other, one end of which is connected to one end of said superconducting current limiting coil (3a) and the other end of which is connected via a quenching switch (3d) to the other end of said current, whereby a synthesized value of voltages ($e_b$, $e_c$, $e_d$, $e_e$) appearing in the first to fourth trigger coils, which are electromagnetically induced by magnetic flux ($\phi_a$) of the current limiting coil (3a) through which the overcurrent flows, is minimized.

Furthermore, a superconducting AC current limiter (200), according to the present invention, comprises:
core means (51);
a superconducting current limiting coil (3a) wound on the core means (51), and inserted into an AC (alternating current) power transmission line, for limiting an overcurrent flowing through the AC power transmission line when a failure happens to occur therein;
a superconducting trigger coil assembly (40) coaxially wound over the superconducting current limiting coil (3a) on the core means (51), and magnetically coupled to the current limiting coil (3a), for triggering current limiting operation by the current limiting coil (3a) when most of said overcurrent flows through the trigger coil assembly (40), said superconducting trigger coil assembly (40) being arranged by first, second, third and fourth trigger coils (3B, 3C, 3D, 3E) in such a manner that said first trigger coil (3B) is series-connected to said fourth trigger coil (3E) thereby to constitute a first series trigger coil circuit, said second trigger coil (3C) is series-connected to said third trigger coil (3D) thereby to constitute a second series trigger coil circuit, said first and second series trigger coil circuits are connected in parallel with each other, one end of which is connected to one end of said superconducting current limiting coil (3a) and the other end of which is connected via a quenching switch (3d) to the other end of said current, whereby a synthesized value of voltages ($e_b$, $e_c$, $e_d$, $e_e$) appearing in the first to fourth trigger coils, which are electromagnetically induced by magnetic flux ($\phi_a$) of the current limiting coil (3a) through which the overcurrent flows, is minimized.

BRIEF DESCRIPTION OF THE DRAWINGS

For a better understanding of the present invention, reference is made to the detailed description in conjunction with the accompanying drawings in which.

DETAILED DESCRIPTION OF THE PREFERRED EMBODIMENTS

Basic Idea

Before describing various types of preferred embodiments, a basic idea of the present invention will now be summarized.

In a superconducting current limiter according to the present invention, trigger coils are so arranged that a synthesized value of voltages appearing in each of the trigger coils, which have been induced from an electromagnetic flux of a current limiting coil, may be minimized.

Circuit Arrangement of First Current Limiter

Figure 1:
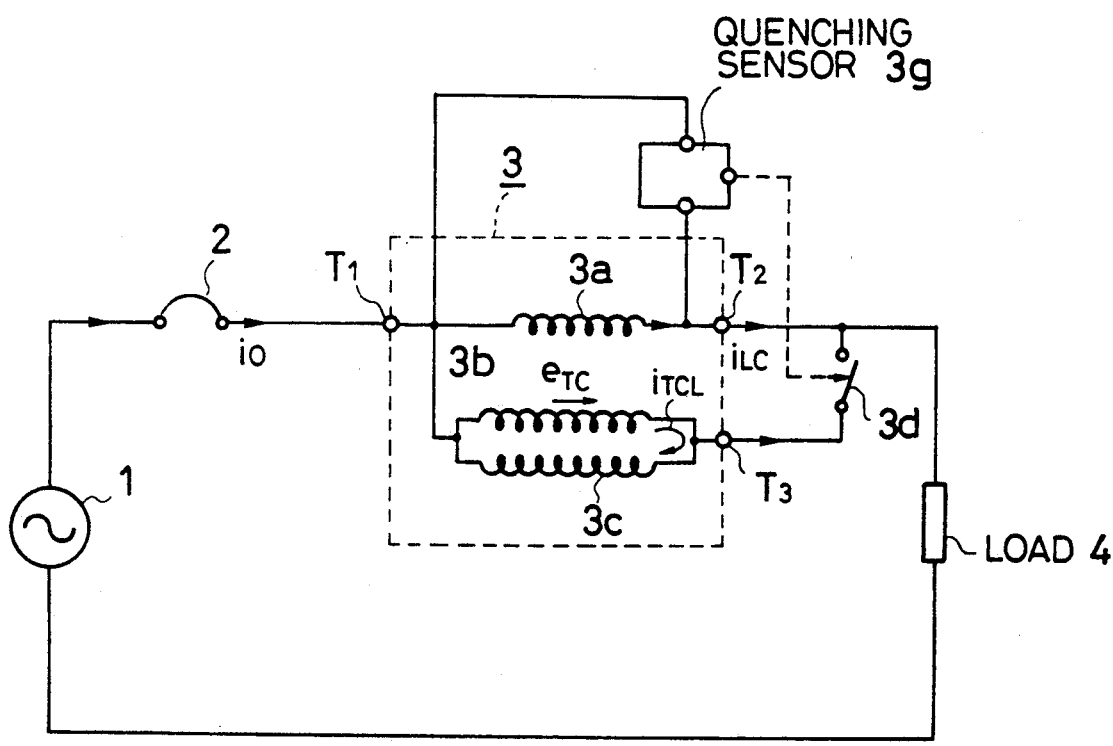
FIG. 1 is a circuit diagram of a conventional superconducting AC current limiter.
Figure 2:
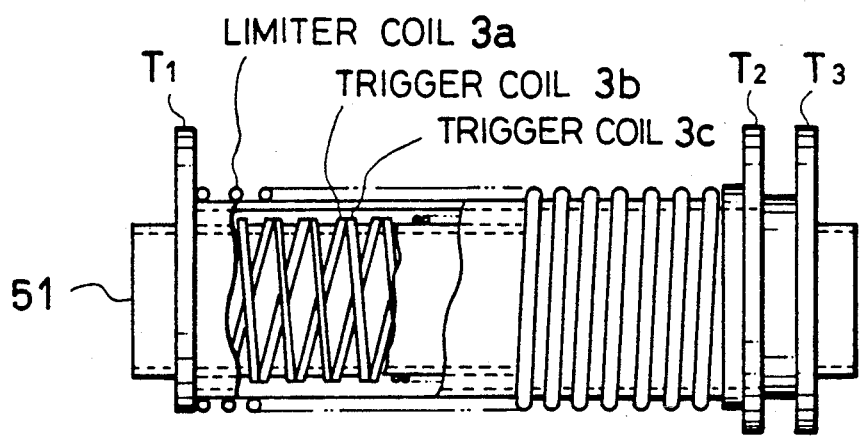
FIG. 2 schematically illustrates the current limiting coil and trigger coils of the current limiter shown in FIG. 1.
Figure 3:
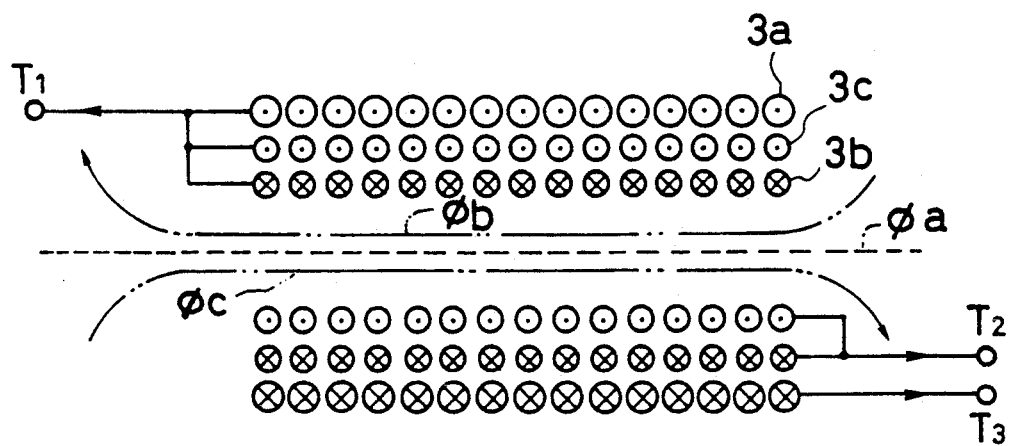
FIG. 3 is an illustration for explaining the conventional current limiting operation of the limiter shown in FIG. 1.
Figure 4:
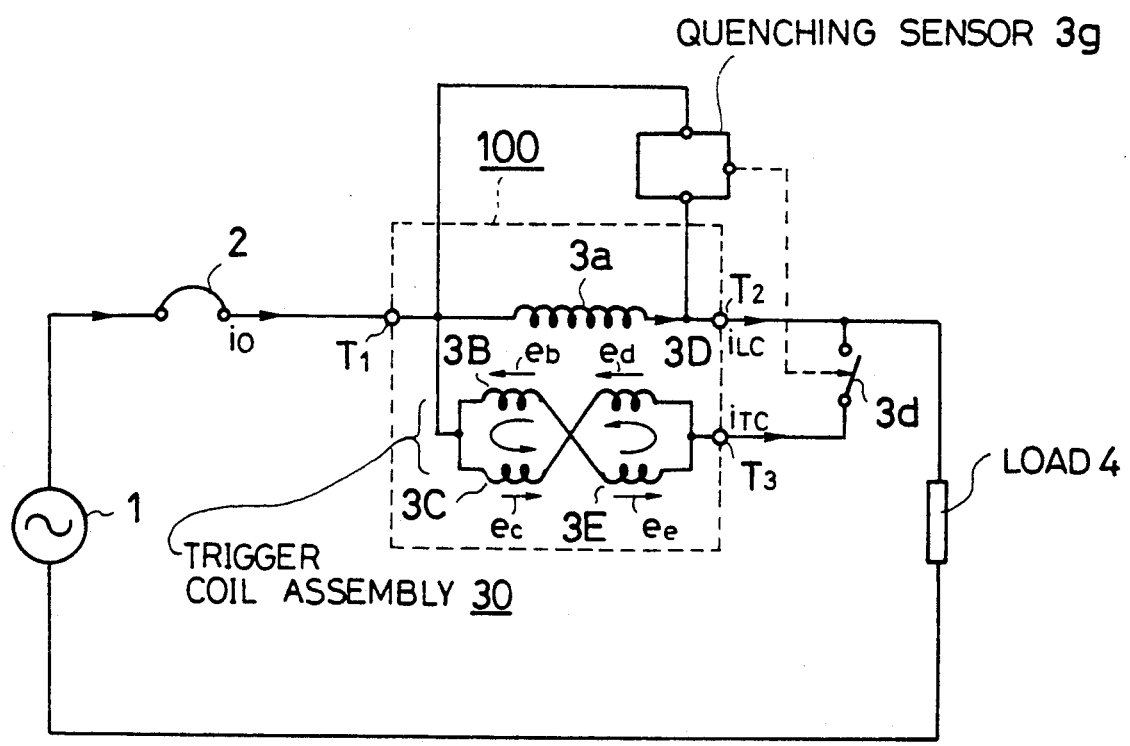
FIG. 4 is a circuit diagram of a superconducting AC current limiter 100 according to a first preferred embodiment of the present invention.

In FIG. 4, there is shown a circuit arrangement of a superconducting current limiter 100 according to a first preferred embodiment of the present invention, constructed based on the above-described basic idea of the present invention. As apparent from FIG. 4, this first superconducting current limiter 100 has the same arrangement as that of the conventional superconducting current limiter shown in FIG. 1, except for an arrangement of a first trigger coil assembly 30. Accordingly, only the arrangement of the first trigger coil assembly 30 will now be described in more detail. That is, the first trigger coil assembly 30 of the first superconducting current limiter 100 is constructed of first to fourth trigger coils 3B to 3E. The first trigger coil 3B is series-connected to the fourth trigger coil 3E, whereas the second trigger coil 3C is similarly connected in series with the third trigger coil 3D. A first series-circuit constructed of the first and fourth trigger coils 3B, 3E is connected parallel with a second series-circuit constructed of the second and third trigger coils 3C, 3D.

Construction of Coil Windings of First Current Limiter 100

Figure 5:
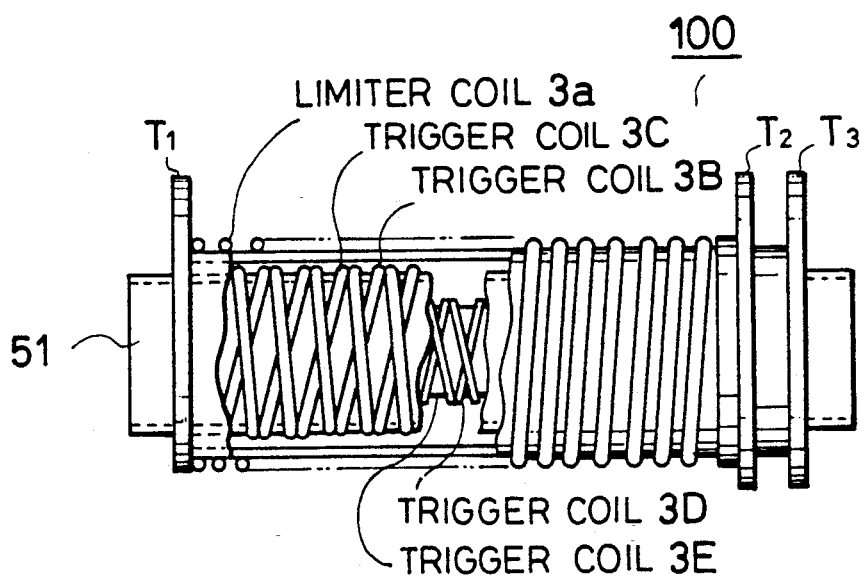
FIG. 5 schematically illustrates coil windings of the first superconducting AC current limiter 100 shown in FIG. 4.
Figure 6:
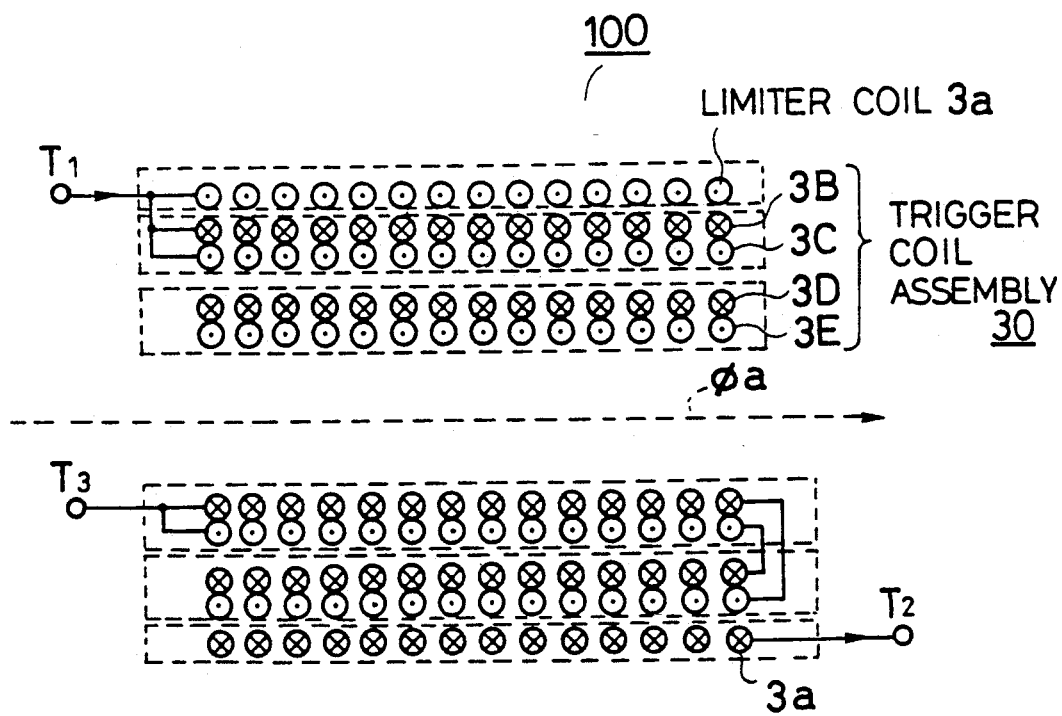
FIG. 6 is an illustration for explaining a current limiting operation of the first current limiter 100.

Referring now also to FIG. 5, an overall construction of coil windings employed in the first superconducting current limiter 100 will be described. As represented in FIG. 5, both the first and second trigger coils 3B and 3C are coaxially arranged inside the current limiting coil 3a wound on the core 51. Furthermore, the third and fourth trigger coils 3D and 3E are coaxially arranged inside the first and second trigger coils 3B and 3C. These trigger coils 3B to 3E are connected in such a manner that voltages "$e_b$", "$e_c$", "$e_d$", and "$e_e$" induced in the first to fourth trigger coils 3B to 3E during the current limiting operation may be canceled with each other, as shown in FIG. 6, whereby a loop current "$i_{TC}$" appearing in the trigger coils may be considerably suppressed. In other words, both the first and third trigger coils 3B and 3D are wound in a right direction, whereas both the second and fourth trigger coils 3C and 3E are wound in a left direction, as viewed in FIG. 6. As a result of such coil windings and connections, the electromagnetically induced voltages "$e_b$", "$e_c$" "$e_d$" and "$e_e$" of the respective trigger coils 3B, 3C, 3D and 3E may be canceled with each other, so that the loop current in the trigger coil assembly 30 may be lowered.

These voltages are electromagnetically induced by the magnetic flux "$\phi_a$" of the current limiting coil 3a.

As previously stated, with the above-described coil arrangement, the first to fourth trigger coils 3B to 3E function as a non-induction coil assembly while the normal current flows through these trigger coils. However, when a very large current such as a shortcircuit current happens to flow through the load 4, the trigger coil assembly 30 is immediately quenched to thereby suppress such an overcurrent, and simultaneously changes the flow of the overcurrent from the trigger coil assembly 30 to the current limiting coil 3a. It should be noted that the current limiting coil 3a can limit such an overcurrent due to a self-reactance effect thereof, and at the same time, produces the magnetic flux "$\phi_a$".

Current Limiting Operation by First Current Limiter 100

Referring back to FIG. 4, current limiting operation by the first current limiter 100 will be described.

Under the normal condition (i.e., no failure overcurrent), most of the circuit current flows through the trigger coil assembly 30, namely the first to fourth trigger coils 3B, 3C, 3D and 3E, so that the magnetic flux "$\phi_a$" generated by the current limiting coil 3a through which a very small normal current flows, is substantially equal to zero. In this normal condition, this circuit current is lower than the critical current value determined by the trigger coil assembly 30. It should be noted that since the diameters of the right-wound first and third trigger coils 3B and 3D are slightly greater than those of the corresponding left-wound second and fourth trigger coils 3C and 3E, respectively (see FIG. 5), the magnetic coupling coefficient thereof is not always equal to "$-1$" and thus a slight leakage inductance might be produced. However, generally speaking, since the value of this leakage inductance is rather smaller than the inductance value of the current limiting coil 3a, these trigger coils 3B, 3C, 3D and 3E may function as the non-inductance element having a resistance value of substantially zero.

If a failure overcurrent happens to flow through the load 4 and then this failure current reaches the critical current determined by the trigger coil assembly 30, the first to fourth trigger coils 3B to 3E are substantially, simultaneously quenched and changed into circuit elements having higher resistance values, whereby such an overcurrent may be suppressed. As a result of the current suppression by the trigger coils, the failure current changes its flow into the current limiting coil 3a. Accordingly, the voltage appearing across this current limiting coil 3a is considerably increased and also the magnetic flux "$\phi_a$" is produced by this coil 3a.

On the other hand, the quenching sensor 3g can detect the occurrence of such a quenching state of the trigger coils 3B to 3E by sensing this voltage appearing at both ends of the current limiting coil 3a, and then opens the trigger switch 3d upon detection of the quenching state. As a consequence, all of the first to fourth trigger coils 3B to 3E are brought into a floating state and thus are not influenced by the power supply 1.

On the other hand, as the magnetic flux $\phi_a$ generated from the current limiting coil 3a through which the major overcurrent flows, passes through all of the trigger coils 3B to 3E, the electromagnetically induced voltages $e_b$, $e_c$, $e_d$, $e_e$ would appear in these trigger coils 3B, 3C, 3D 3E. However, as previously explained, these induced voltages are magnetically canceled with each other. That is, the phases of these induced voltages are substantially in synchronism with each other. Assuming now that the directions of the induced voltages from the first and second trigger coils 3B and 3C are defined as plus (+) directions, those of the third and fourth trigger coils 3D and 3E are defined as minus (−) direction. Accordingly, a synthesized value of these induced voltages becomes $(e_b+e_c-e_d-e_e)$, each of which may be canceled with each other, and thus becomes practically a very small value. To the contrary, since the internal impedance of the trigger coil assembly 30 is increased in directly proportional to the total number of the series coil circuit arrangements, as will be discussed later, the loop current flowing through the trigger coil assembly 30 may be suppressed to become a very small current value, as compared with the conventional loop current.

More specifically, in the trigger coils which have been quenched, superconductive coil portions are mixed with non-superconductive coil portions at random. Thereafter, since the trigger switch $3d$ is opened by the quenching sensor $3g$ and thus no circuit current is supplied to the trigger coils 3B to 3E, the overall trigger coil assembly 30 will be recovered to the superconductive states. At this time, the internal impedance $Z_{TCt}$ of the trigger coil assembly 30 is determed by the following equation (3) based on the self inductances $L_1$, $L_2$, $L_3$, $L_4$ of the first to fourth trigger coils 3B, 3C, 3D, 3E; a synthesized value "$M_0$" of the mutual inductances among these trigger coils 3B to 3E; and also resistance values $R_1$, $R_2$, $R_3$, $R_4$, of the non-superconductive portions within the trigger coil assembly 30;

$$Z_{TCt} = \sqrt{\{\omega(L_o + M_o)\}^2 + (R_1 + R_2 + R_3 + R_4)^2} \quad (3)$$

where $\omega=2\pi f$, and $$L_0=L_1+L_2+L_3+L_4$$

Considering now the value of the mutual inductance "$M_0$". It is possible to control this value by changing a ratio (Rd) of the diameters of the first and second trigger coils 3B and 3C to those of the third and fourth trigger coils 3D and 3E. Precisely speaking, when the ratio (Rd) of the diameters of the first and second trigger coils 3B, 3C to those of the third and fourth trigger coils 3D, 3E is equal to 1, the value of the mutual inductance $M_0$ becomes "$-L_0$". When this ratio "Rd" is gradually increased from 1, the value of the inductance $M_0$ gradually reaches "$+L_0$". As a consequence, it is also possible to set this mutual inductance "$M_0$" to zero (0) by properly selecting this ratio (Rd), and thus a summation of the inductances $L_1$, $L_2$, $L_3$, $L_4$ of the first to fourth trigger coils 3B to 3E will remain as the internal impedance of the trigger coil assembly 30 obtained when this trigger coil assembly 30 returns to its superconducting state. In other words, the internal impedance $Z_{TCt}$ of the trigger coil assembly 30 may be substantially equivalent to the conventional internal impedance by additionally employing the third and fourth trigger coils 3D and 3E in the superconducting current limiter 100 and by changing the diameters of these trigger coils 3D and 3E.

As a result, a maximum loop current value "$i_{TCLm}$" flowing through the trigger coil assembly 30 is given by the following quation (4) under the superconductive recovery state:

$$i_{TCLm}=(e_b+e_c-e_d-e_e)/\{\omega(L_1+L_2+L_3+L_4)\} \quad (4)$$

Consequently, the maximum the loop current $i_{TCLm}$ may be considerably reduced to a very small value, as compared with the conventional loop current. Therefore, a Joule heat loss occurring in this trigger coil assembly 30 due to this very small loop current is considerably lowered, so that a total amount of evaporated coolant (e.g., liquid helium) may be reduced and the recovery time of the trigger coil assembly 30 to the superconducting state may be shortened. Furthermore, since another loop current flowing through the trigger coil assembly 30 may be extremely lowered when the trigger coil assembly 30 completely recovers to the superconducting state, it is possible to prevent the trigger coil assembly 30 from being again quenched. Then, the superconducting current limiter 100 can be surely recovered from the non-superconducting state, where the failure overcurrent flows through the current limiter 100.

Arrangement of Second Superconducting Current Limiter 200

Figure 7:
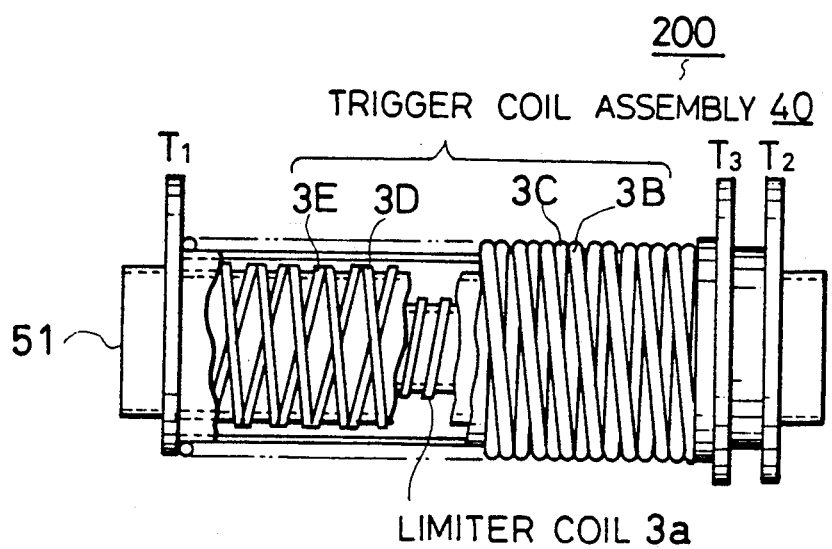
FIG. 7 schematically illustrates coil windings of a superconducting AC current limiter 200 according to a second preferred embodiment of the present invention; and, FIG. 8 is an illustration for explaining a current limiting operation of the second current limiter 200 represented in FIG. 7.
Figure 8:
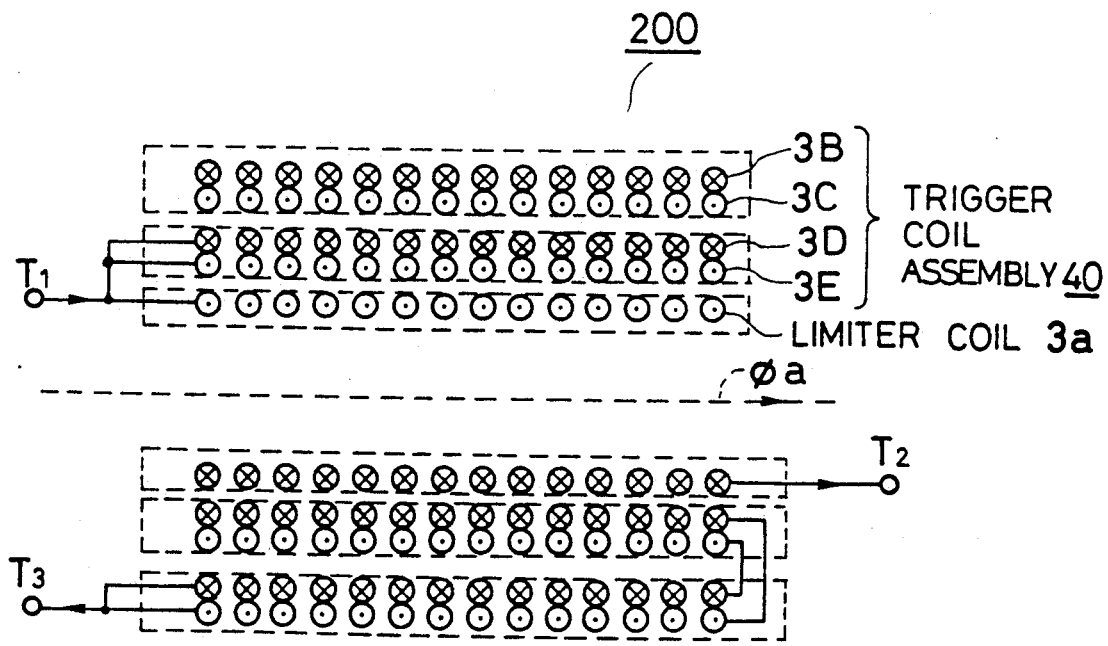

FIGS. 7 and 8 illustrate an arrangement of a superconducting current limiter 200 according to a second preferred embodiment of the present invention, and a connection diagram thereof, which includes a current limiting coil $3a$, and also four trigger coils 3B, 3C, 3D and 3E. These four trigger coils 3B to 3E constitute a second trigger coil assembly 40. A different arrangement of the second superconducting current limiter 200 from that of the first superconducting current limiter 100 is as follows. As apparent from FIGS. 7 and 8, the current limiting coil $3a$ is wound at the insidemost of the core 51, both the third and fourth trigger coils 3D and 3E are wound on this current limiting coil $3a$, and then both the first and second trigger coils 3B and 3C are furthermore wound on the third and fourth trigger coils 3D and 3E. The remaining arrangements of this second superconducting current limiter 200 are the same as those of the first superconducting current limiter 100, and then the effects achieved by the second current limiter 200 are similar to those of the first current limiter 100.

The present invention is not limited to the above-described preferred embodiments, but may be modified. For instance, in order to set the synthesized value of the voltages induced in the trigger coils 3B to 3E during the current limiting operation, a ratio of the windings of the first and second trigger coils 3B, 3C to those of the third and fourth trigger coils 3D, 3E may be varied. That is, assuming now that the magnetic flux $\phi_a$ produced from the current limiting coil $3a$ is uniformly distributed inside this coil $3a$, the voltages "$e_b$", "$e_c$", "$e_d$", "$e_e$" induced from the respective trigger coils 3B to 3E are directly proportional to the square of a turn number "N" and a diameter "D" of the respective trigger coils, which is expressed by:

$$e \propto N.d\phi/d_t \quad (5),$$

where $d\phi \propto D^2$.

As a consequence, in order that such a condition where these induced voltages $e_b$, $e_c$, $e_d$ and $e_e$ are nearly equal to each other is achieved, namely the synthesized value of the voltages induced from trigger coils is selected to be zero, a turn number of trigger coils, e.g., 3D and 3E having a smaller diameter may be made larger than that of remaining trigger coils, e.g., 3B and 3C having a large diameter.

As previously described in detail, according to the present invention, since the trigger coil assembly is so arranged that the synthesized value of the voltages induced from each of the trigger coils by receiving the magnetic flux generated from the current limiting coil 3A, the resultant loop current produced in the trigger coil assembly during the current limiting operation may be considerably reduced, as compared with the conventional loop current. Accordingly, the Joule heat loss occurring in the trigger coil assembly may be lowered, the amount of the consumed coolant may be also lowered, so that the time required for recovering the superconductive state with respect to the current limiter may be shortened. Furthermore, since the loop current occurring in the trigger coil assembly may be greatly reduced, it may prevent the trigger coils from being quenched and therefore, the trigger coils may be surely recovered to their superconductive states.

What is claimed is:

1. A superconducting AC current limiter comprising:
    core means;
    a superconducting current limiting coil wound on the core means and inserted into an AC (alternating current) power transmission line, for limiting an overcurrent flowing through the AC power transmission line when a failure happens to occur therein;
    a superconducting trigger coil assembly coaxially wound inside the superconducting current limiting coil on the core means, and magnetically coupled to the current limiting coil, for triggering current limiting operation by the current limiting coil when most of said overcurrent flows through the trigger coil assembly, said superconducting trigger coil assembly being arranged by first, second, third and fourth trigger coils in such a manner that said first trigger coil is series-connected to said fourth trigger coil thereby to constitute a first series trigger coil circuit, said second trigger coil is series-connected to said third trigger coil thereby to constitute a second series trigger coil circuit, said first and second series trigger coil circuits are connected in parallel with each other, one end of which is connected to one end of said superconducting current limiting coil and the other end of which is connected via a quenching switch to the other end of said current, whereby a synthesized value of voltages appearing in the first to fourth trigger coils, which are electromagnetically induced by magnetic flux of the current limiting coil through which the overcurrent flows, is minimized.

2. A superconducting AC current limiter as claimed in claim 1, wherein said first and third trigger coils are wound in a right-hand direction with respect to the core means, and also said second and fourth trigger coils are wound in a left-hand direction, whereby said trigger coil assembly is wound under non-electromagnetic induction condition.

3. A superconducting AC current limiter as claimed in claim 1, further comprising:
    quenching sensor means connected in parallel to said superconducting current limiting coil, for sensing that said superconducting trigger coil assembly is quenched when said overcurrent flows through said trigger coil assembly, whereby said quenching switch is opened by said quenching sensor means.

4. A superconducting AC current limiter as claimed in claim 1, wherein a ratio of diameters of said first and second trigger coils to those of said third and fourth trigger coils is varied so as to reduce a mutual inductance among the first to fourth trigger coils to zero, whereby a summation of self-inductances of the first to fourth trigger coils is substantially equal to an internal impedance of the trigger coil assembly under the superconductive condition.

5. A superconducting AC current limiter comprising:
    core means;
    a superconducting current limiting coil wound on the core means and inserted into an AC (alternating current) power transmission line, for limiting an overcurrent flowing through the AC power transmission line when a failure happens to occur therein;
    a superconducting trigger coil assembly coaxially wound over the superconducting current limiting coil on the core means, and magnetically coupled to the current limiting coil, for triggering current limiting operation by the current limiting coil when most of said overcurrent flows through the trigger coil assembly, said superconducting trigger coil assembly being arranged by first, second, third and fourth trigger coils in such a manner that said first trigger coil is series-connected to said fourth trigger coil thereby to constitute a first series trigger coil circuit, said second trigger coil is series-connected to said third trigger coil thereby to constitute a second series trigger coil circuit, said first and second series trigger coil circuits are connected in parallel with each other, one end of which is connected to one end of said superconducting current limiting coil and the other end of which is connected via a quenching switch to the other end of said current, whereby a synthesized value of voltages appearing in the first to fourth trigger coils, which are electromagnetically induced by magnetic flux of the current limiting coil through which the overcurrent flows, is minimized.

6. A superconducting AC current limiter as claimed in claim 5, wherein said third and fourth trigger coils are wounded on said current limiting coil, and said first and second trigger coils are further wound on said third and fourth trigger coils.

7. A superconducting AC current limiter as claimed in claim 5, further comprising:
    quenching sensor means connected in parallel to said superconducting current limiting coil, for sensing that said superconducting trigger coil assembly is quenched when said overcurrent flows through said trigger coil assembly, whereby said quenching switch is opened by said quenching sensor means.

8. A superconducting AC current limiter as claimed in claim 5, wherein a ratio of diameters of said first and second trigger coils to those of said third and fourth trigger coils is varied so as to reduce a mutual inductance among the first to further trigger coils to zero, whereby a summation of self-conductances of the first to fourth trigger coils is substantially equal to an internal impedance of the trigger coil assembly under the superconductive condition.

* * * * *